United States Patent
Krachkovsky et al.

(10) Patent No.: US 8,599,959 B2
(45) Date of Patent: Dec. 3, 2013

(54) METHODS AND APPARATUS FOR TRELLIS-BASED MODULATION ENCODING

(75) Inventors: Victor Krachkovsky, Allentown, PA (US); Shaohua Yang, San Jose, CA (US); Erich F. Haratsch, Bethlehem, PA (US); Johnson Yen, Fremont, CA (US)

(73) Assignee: LSI Corporation, San Jose, CA (US)

( * ) Notice: Subject to any disclaimer, the term of this patent is extended or adjusted under 35 U.S.C. 154(b) by 331 days.

(21) Appl. No.: 12/982,129

(22) Filed: Dec. 30, 2010

(65) Prior Publication Data

US 2012/0170678 A1 Jul. 5, 2012

(51) Int. Cl.
*H04L 27/00* (2006.01)

(52) U.S. Cl.
USPC .......................................... 375/295

(58) Field of Classification Search
USPC ............. 375/259, 262, 295; 360/41, 55; 714/792, 794, 795, 796
See application file for complete search history.

(56) References Cited

U.S. PATENT DOCUMENTS

| | | | |
|---|---|---|---|
| 6,788,223 B2 | 9/2004 | Bliss et al. | |
| 6,999,532 B2* | 2/2006 | Kuo et al. | 375/341 |
| 7,191,386 B2 | 3/2007 | Kuznetsov | |
| 7,205,912 B1* | 4/2007 | Yang et al. | 341/59 |
| 7,848,396 B1* | 12/2010 | Wu | 375/220 |
| 2004/0205446 A1* | 10/2004 | Yamagishi | 714/792 |
| 2006/0120244 A1* | 6/2006 | Miyauchi et al. | 369/59.22 |
| 2006/0174185 A1 | 8/2006 | Krachkovsky et al. | |
| 2008/0148129 A1* | 6/2008 | Moon et al. | 714/758 |
| 2010/0198850 A1* | 8/2010 | Cytron et al. | 707/758 |

FOREIGN PATENT DOCUMENTS

EP 0 601 940 B1 7/1998

OTHER PUBLICATIONS

Immink et al., Performance Assessment of DC-Free Multimode Codes, IEEE Trans. Commun., vol. 45, No. 3 (Mar. 1997).
Blaum et al., "Reverse Concatentation with Maximum Transition Run (MTR) Codes for High-Density Perpendicular Recording," GLOBECOM 2008: 3070-3073.
Kavcic et al., "Matched Information Rate Codes for Partial Response Channels," IEEE Trans. IT. 51,3,2005,973-989.
Minowa et al., "Application of Soft-In/Soft-Out Viterbi Algorith to Turbo Trellis-Coded Modulation," IEICE Trans. Fundamentals, vol. E81, No. 10 (Oct. 1998).

* cited by examiner

*Primary Examiner* — Tesfaldet Bocure
(74) *Attorney, Agent, or Firm* — Ryan, Mason & Lewis, LLP

(57) ABSTRACT

Methods and apparatus are provided for trellis-based modulation encoding. A signal is modulation encoded by encoding one or more blocks of the signal using one or more corresponding edges in a trellis, wherein each edge in the trellis has a corresponding bit pattern; selecting a winning path through the trellis based on at least one transition-based run-length constraint; and generating an encoded sequence using edges associated with the winning path. Exemplary trellis pruning techniques are also provided. The winning path through the trellis is selected by minimizing one or more modulation metrics.

33 Claims, 10 Drawing Sheets

*FIG. 5A*
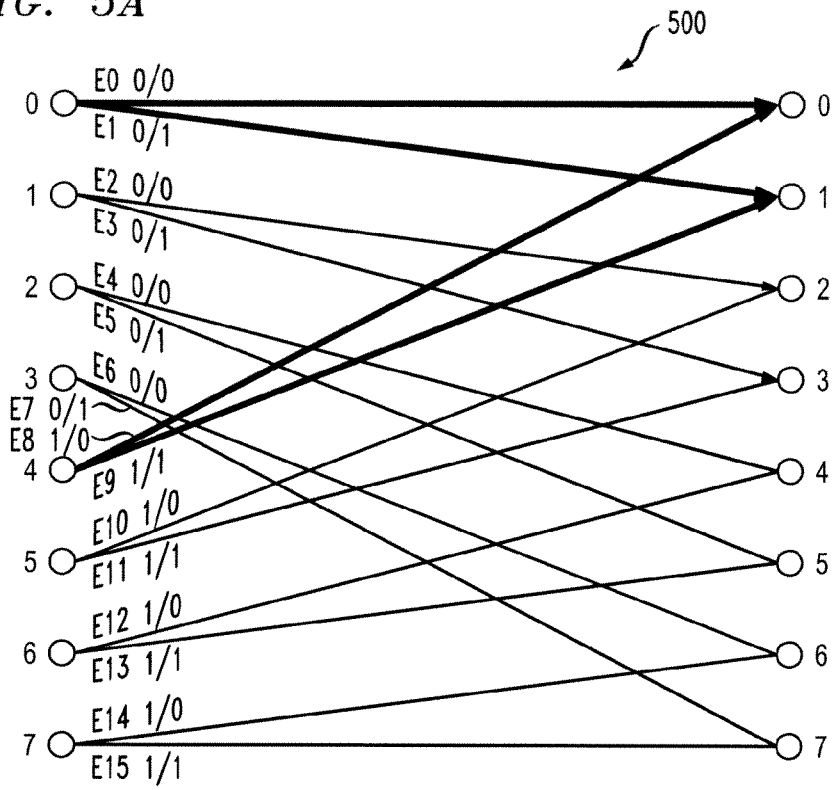
*FIG. 5B*
| E | EDGE BITS | E | EDGE BITS | E | EDGE BITS | E | EDGE BITS |
|---|---|---|---|---|---|---|---|
| 0 | 11011111 | 4 | 11010000 | 8 | 10001000 | 12 | 10000111 |
| 1 | 00100010 | 5 | 00101101 | 9 | 11111011 | 13 | 11110100 |
| 2 | 00101111 | 6 | 01110101 | 10 | 01111000 | 14 | 00100010 |
| 3 | 11010010 | 7 | 10001000 | 11 | 00001011 | 15 | 01010001 |
*FIG. 5C*
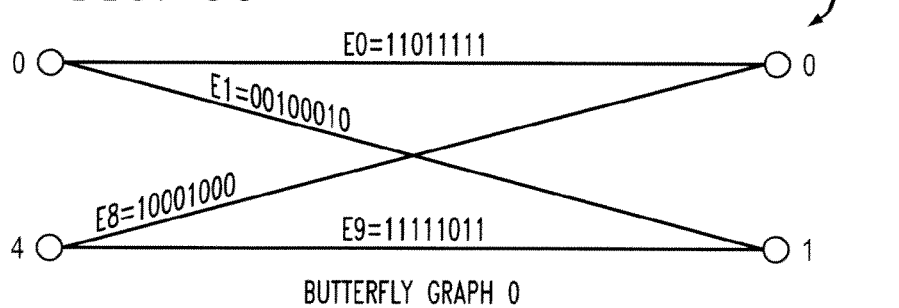
BUTTERFLY GRAPH 0

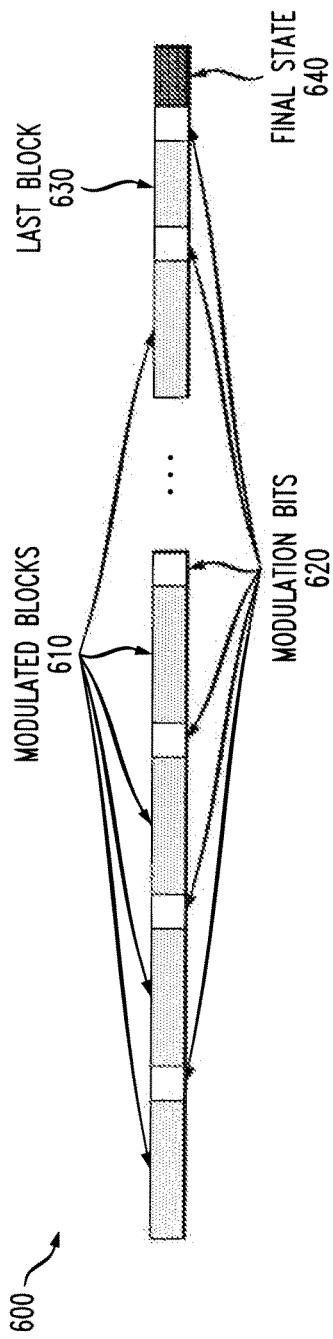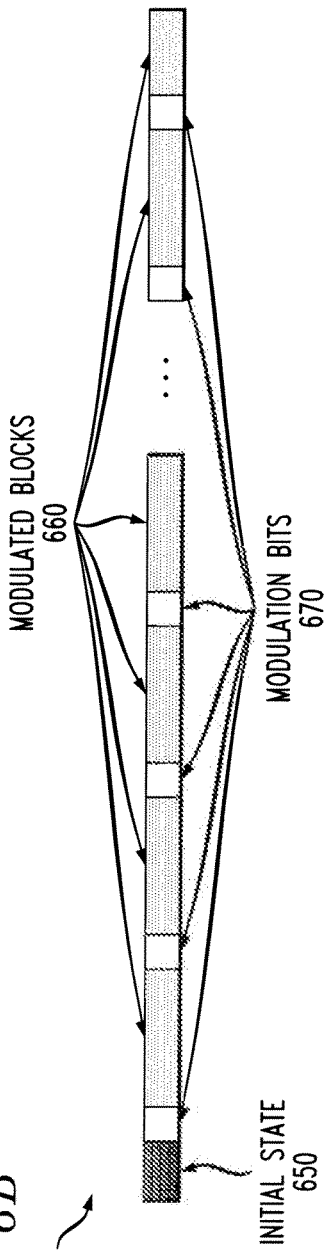
FIG. 6A
FIG. 6B

| 1 | 0 | 1 | 1 | 0 | 1 | 0 | 0 | 1 | ... |

3-BIT SLIDING WINDOW →
710

| WINDOW CONTENTS: | 000 | 001 | 010 | 011 | 100 | 101 | 110 | 111 |
|---|---|---|---|---|---|---|---|---|
| $\delta_1(X)$ (FLAT) | 0 | 0 | 1 | 1 | 0 | 0 | 1 | 1 |
| $\delta_2(X)$ (MODIFIED) | 0 | 0 | 1 | 1 | 0 | 0 | 1 | 3 |

METHODS AND APPARATUS FOR TRELLIS-BASED MODULATION ENCODING

FIELD OF THE INVENTION

The present invention relates generally to the transmission or storage of digital information and, more particularly, to methods and apparatus for modulation encoding of digital information prior to such transmission or storage.

BACKGROUND OF THE INVENTION

Encoding is the process by which information from a source is converted into symbols to be communicated. Decoding is the reverse process, whereby these code symbols are converted back into information understandable by a receiver.

Data encoding adds redundancy or parity bits (or both) to streams of digital data to reduce susceptibility to data corruption. Data corruption typically occurs in the form of interference or noise (or both). Interference may take the form, for example, of intersymbol interference. The noise may comprise channel noise.

Error correction coding (ECC) allows a receiver to detect and possibly correct errors introduced into the data by interference or noise. In this manner, appropriate data encoding can reduce or eliminate the need to retransmit or rewrite corrupted data, or to identify data loss if rewriting is not possible. Error correction coding schemes may include, for example, convolutional coding, block coding, and Reed-Solomon coding.

A typical coding arrangement includes a modulation encoder that transforms data into codewords according to one or more given constraints. Generally, modulation encoding techniques are used to map a random input signal (comprised of bits) to a signal having desirable properties. For example, modulation coding techniques can be employed to enforce one or more constraints that decrease error probabilities, increase the signal-to-noise ratio (SNR) or otherwise improve the performance of the channel synchronization and detection (or a combination of the foregoing). For example, a number of modulation coding techniques have been proposed to limit the number of successive transitions within a predefined data window, to avoid signal degradation at the Nyquist frequency. Maximum transition run (MTR) codes, for example, are one type of modulation code that limits the number of consecutive transitions.

A need exists for improved methods and apparatus for modulation encoding. Yet another need exists for modulation encoding techniques that employ a trellis.

SUMMARY OF THE INVENTION

Generally, methods and apparatus are provided for trellis-based modulation encoding. According to one aspect of the invention, modulation encoding of a signal comprises encoding one or more blocks of the signal using one or more corresponding edges in a trellis, wherein each edge in the trellis has a corresponding bit pattern; selecting a winning path through the trellis using a Viterbi algorithm based on at least one transition-based run-length constraint; and generating an encoded sequence using edges associated with the winning path. In one exemplary implementation, each block is encoded by scrambling the block with the corresponding edge, although more general mappings can be applied. For example, each block can be encoded with the corresponding edge using an exclusive OR function.

According to a further aspect of the invention, one or more edges in the trellis are pruned (i) if a given one of the edges violates a run-length constraint; (ii) to reduce a path memory associated with the trellis; or (iii) if a given one or more edges were not selected by a majority voting rule. In one exemplary embodiment, each edge in the trellis has a corresponding bit pattern that is stored with a reduced number of bits and is expanded to a number of bits associated with the blocks of the signal.

According to yet another aspect of the invention, the winning path through the trellis is selected by minimizing one or more modulation metrics. In various embodiments, the modulation metrics: suppress one or more error events; assign a higher weight to longer transition runs; are computed within a sliding window; and/or assign a higher weight to transitions than to non-transitions.

A more complete understanding of the present invention, as well as further features and advantages of the present invention, will be obtained by reference to the following detailed description and drawings.

BRIEF DESCRIPTION OF THE DRAWINGS

FIG. 5A illustrates an exemplary 8-state trellis;

FIG. 5B is a table illustrating exemplary 8-bit patterns associated with each edge of FIG. 5A;

FIG. 5C illustrates an exemplary butterfly graph used in the trellis of FIG. 5A;

FIG. 6A illustrates an exemplary encoded output sequence that employs a final state in a traceback configuration and FIG. 6B illustrates an exemplary alternate encoded output sequence that employs an initial state in a forward addressing configuration for the path memory;

FIG. 7A illustrates the computation of modulation metrics in a sliding bit window that processes the encoded sequence and FIG. 7B is a sample table indicating the modulation metric value $\delta(x)$ for each possible 3-bit value in the window of FIG. 7A;

DETAILED DESCRIPTION

The present invention provides improved methods and apparatus for modulation encoding. According to one aspect of the invention, a modulation encoder transforms data into codewords according to one or more given constraints using a trellis. Each block of an input signal is encoded using a plurality of corresponding edges in the trellis. A winning path is selected through the trellis using a Viterbi algorithm. The encoded sequence is generated by inserting data associated with the winning path into an output stream.

Figure 1:
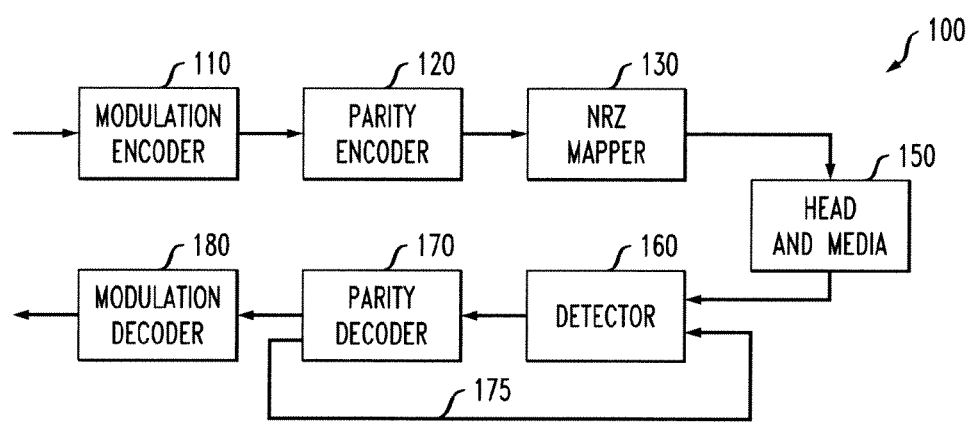
FIG. 1 illustrates an exemplary magnetic recording system in which the present invention can operate.

FIG. 1 illustrates an exemplary magnetic recording system 100 in which the present invention can operate. As shown in FIG. 1, the exemplary magnetic recording system 100 comprises a modulation encoder 110, a parity encoder 120 and a precoder 130, such as an NRZ Mapper. The modulation encoder 110 transforms data into codewords according to a given constraint, to improve the performance of the channel synchronization and detection. The parity encoder 120 may optionally include an ECC encoder (not shown), such as a Reed-Solomon encoder, a Low Density Parity check (LDPC) encoder or a Turbo Product Code (TPC) encoder. For a detailed discussion of direct and reverse modulation and ECC encoding arrangements, see, for example, U.S. patent application Ser. No. 11/050,208, entitled "Method and Apparatus for Encoding and Precoding Digital Data Within Modulation Code Constraints," incorporated by reference herein.

An ECC encoder typically encodes data to protect it from different channel distortions including random noise and error bursts. Generally, the ECC encoder calculates the ECC parity of the codeword and inserts one or more ECC parity symbols into the codeword. The parity encoder 120 may be embodied, for example, as a Turbo Product Code (TPC) encoder or LDPC (Low Density Parity Check) encoder. The parity encoder 120 typically calculates the parity of a codeword and inserts one or more parity bits into the codeword. The ECC encoder aims to improve the frame/symbol error rate, while the parity encoder 120 is designed to improve the bit error rate.

The precoder 130 works to improve the performance of any of the above-mentioned error-correction schemes by using one or more transfer functions or other conventional data manipulation techniques. The exemplary precoder 130 can be defined, for example, by a transfer function of $1/(1+D)$, where D indicates a unit delay.

When used with the $1/(1+D)$ precoder 130, the output from the modulation encoder 110 presents a data stream having a non-return-to-zero inverse (NRZI) waveform shape. That is, the encoder output is in NRZI notation, meaning that a "1" designates the recording of a transition and a "0" represents the lack of a transition. In this situation, the $1/(1+D)$ precoder 130 converts an NRZI data stream into a data stream in non-return-to-zero (NRZ) notation, where a "1" represents a logical high level and a "0" represents a logical low level. Generally, any precoder 130 converts an unprecoded data stream into a channel NRZ data stream.

The NRZ data stream can be recorded or transmitted on a channel 150. The channel 150 may be embodied, for example, as a magnetic head or another media, as shown in FIG. 1, or as a communication channel. The encoded data that is received or read from the channel 150 is decoded by a detector 160, parity decoder 170 and a modulation decoder 180. As shown in FIG. 1, there is optionally a feedback path 175 from the output of parity decoder 170 to the input of detector 160, due to the recursive nature of LDPC parity decoders.

The present invention recognizes that the SNR characteristics of the modulation encoder 110 can be improved by transforming the input data into codewords according to one or more given constraints using a trellis. Each block of an input signal is encoded by the modulation encoder 110 using a plurality of corresponding edges in the trellis. A winning path is selected through the trellis using a Viterbi algorithm. The encoded sequence is generated by inserting data associated with the winning path into an output stream. In this manner, a modulation encoder 110 in accordance with the present invention applies the Viterbi algorithm to user data in the write path (in contrast to conventional applications of the Viterbi algorithm, where it is applied to channel symbols in the read path).

According to a further aspect of the invention, the Viterbi algorithm selects the winning path by minimizing one or more modulation metrics. The modulation metrics can be selected, for example, to minimize the error probability in the channel 150. The modulation metrics can be fixed or selected by optimizing over different density and jitter conditions.

As previously indicated, modulation encoders 110 transform data into codewords according to one or more constraints, to improve the performance of the channel synchronization and detection. Generally, the modulation encoder 110 could implement, for example, run length limited (RLL) coding. RLL coding limits the length of runs of repeated bit values (i.e., when the signal value does not change) in the output NRZ data. In particular, RLL coding can ensure a maximal separation, k, between adjacent transitions to support loop control (e.g., in the timing loop). Generally, if the same-symbol run length is too long, clock recovery is difficult, so such an RLL encoder is used to improve clock recovery, as well as other loop performance.

In addition, in magnetic recording channels with high bit densities, there may be constraints not only on the maximum run-length but also on the number of successive transitions permitted (or the number of transitions permitted in a given window). Coding with constraints on transitions can be used to facilitate data transmission over a communications channel with bandwidth limits. In particular, coding that provides a maximal run length, j, for successive transitions is used to avoid signal degradation at the Nyquist frequency. As indicated above, MTR codes are one example of such RLL codes. See, for example, M. Blaum et al., "Reverse Concatenation with Maximum Transition Run (MTR) Codes for High-Density Perpendicular Recording," GLOBECOM 2008, 3070-73 (2008), incorporated by reference herein.

Thus, according to yet another aspect of the invention, discussed further below in a section entitled "Transition-Related Constraints," the disclosed trellis-based modulation encoder 110 supports transition-based run-length constraints, such as transition run-length constraints or constraints on the number of permitted transitions.

In a further variation, the disclosed trellis-based modulation encoder 110 optionally supports the suppression of DC contents in the modulated data. For a more detailed discussion of DC Control techniques, see, for example, K. A. S. Immink and L. Patrovics, "Performance Assessment of DC-Free Multimode Codes," IEEE Trans. Comm., Vol. 45, No. 3 (March 1997), or U.S. Pat. No. 7,191,386, entitled "Method and Apparatus for Additive Trellis Encoding," each incorporated by reference herein. Modulation codes can also be used to enhance the SNR performance of the channel 150, in a known manner. For example, MTR codes and polarity codes are known to enhance SNR performance. For a discussion on the use of polarity codes to control the number of transitions, see, for example, U.S. Pat. No. 6,788,223, entitled "High Rate Coding for Media Noise," or PCT Application Serial No. PCT/US09/49330, entitled "Methods and Apparatus for Intercell Interference Mitigation Using Modulation Coding," each incorporated by reference herein. For example, one known "bit flipping" polarity coding solution flips the bit values in the encoded block if the number of "ones" is more than half the total number of bits.

With conventional techniques, coding constraints are often used in combination with SNR enhancing coding, resulting in additional rate loss. Another aspect of the invention, however, employs the same modulation code to support both transition-related coding constraints and SNR enhancing coding.

The above-mentioned transition-related constraints are particularly important in evolving magnetic recording channels that perform error correction using Low Density Parity Check (LDPC) codes. For applications requiring error correcting capability, LDPC codes are increasingly used. A number of techniques have been proposed or suggested for decoding of LDPC codes. See, e.g., A. J. Blanksby and C. J. Howland, "A 690-mW 1-Gb/s 1024-b, Rate-1/2 Low-Density Parity-Check Decoder," IEEE J. Solid-State Circuits, Vol. 37, 404-412 (March 2002) and U.S. Pat. No. 6,539,367, to Blanksby et al., each incorporated by reference herein.

Generally, good LDPC performance requires either low "noise energy per word" or high "signal energy per word" (and preferably, both). In state-of-the-art channels, the higher proportion of noise comes from transition jitter and transition width variation type of noise, rather than from Gaussian noise. Thus, the noise energy is proportional to the number of transitions per word. In addition, channels typically exhibit significant inter-symbol interference (ISI) and poor channel performance around the Nyquist frequency. Thus, the signal energy is proportional to 1/{transition run-length} (primarily because successive transitions shift the signal frequency to the Nyquist frequency).

Trellis Modulation Encoding

Figure 2:
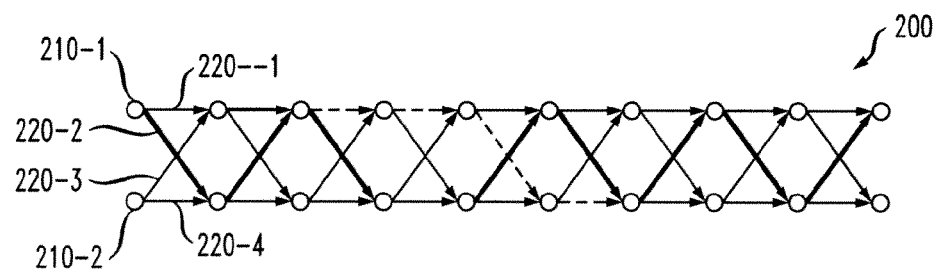
FIG. 2 illustrates an exemplary trellis that may be employed in accordance with the present invention for modulation encoding.

FIG. 2 illustrates an exemplary trellis 200 that may be employed in accordance with the present invention for modulation encoding. In the exemplary trellis 200, each node, such as nodes 210-1 and 210-2, corresponds to a distinct state at a given time, and each edge, such as edges 220-1 through 220-4, represents a transition to some new state at the next time instant. In the embodiment of FIG. 2, the exemplary trellis 200 has M=2 states and edges that connect states of level n to states of level n+1. A trellis of M states typically has 2*M edges. Generally, for better modulation performance, M should be large enough (e.g., M=8), but it may increase the complexity of the metrics computation. Generally, the present invention recognizes that a trellis 200 has an abstract structure and provides good covering properties in binary space.

As discussed hereinafter, each trellis edge 220 is labeled by a block of n bits (also referred to as a trellis block). Each trellis block corresponds to a different polarity code and can be applied (e.g., via an exclusive OR (XOR) operation) to an input block to map or scramble the input block into an encoded block.

Figure 3A:
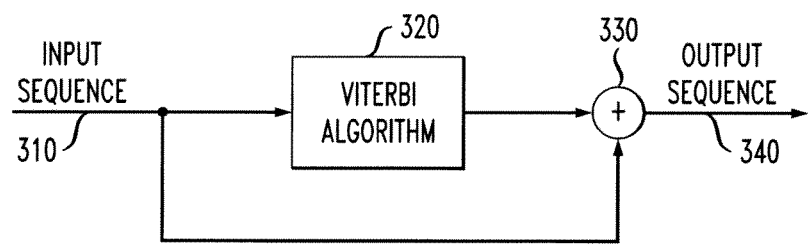
FIG. 3A is a schematic block diagram of an encoder that employs trellis-based modulation encoding in accordance with the present invention.
Figure 3B:
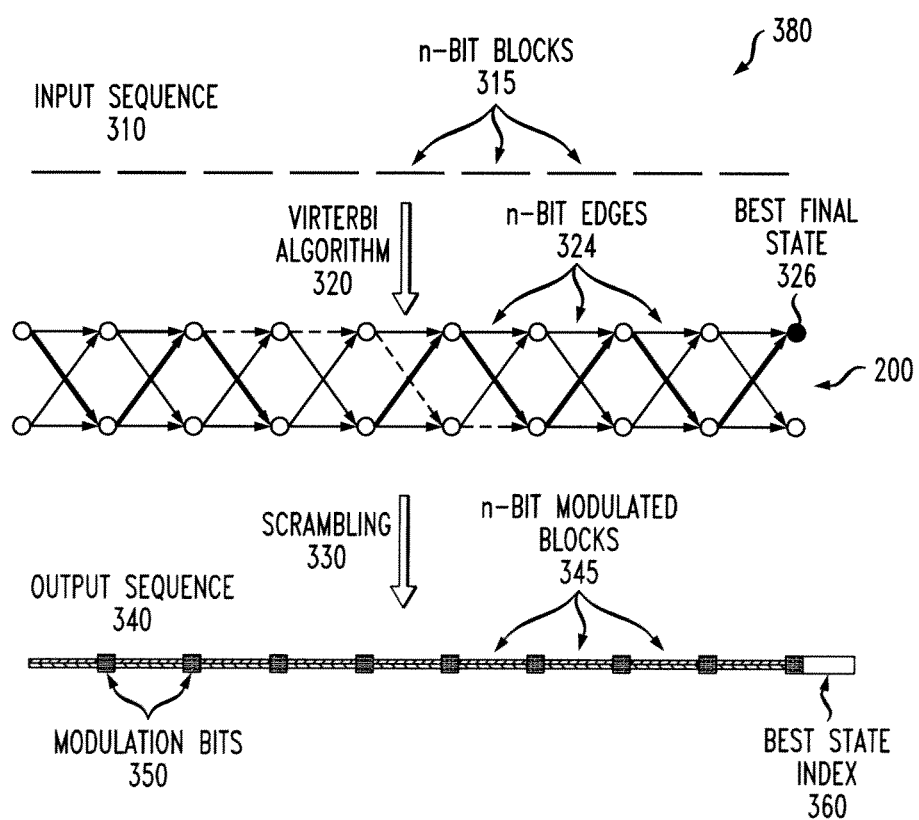
FIG. 3B illustrates a trellis modulation coding process incorporating features of the present invention.

FIG. 3A is a schematic block diagram of an encoder 300 that employs trellis-based modulation encoding in accordance with the present invention. In addition, FIG. 3B illustrates a trellis modulation coding process 380 incorporating features of the present invention. As shown in FIGS. 3A and 3B, a user input sequence 310 is organized in n-bit blocks 315. For example, the block size, n, may be 100. As discussed above and shown in FIG. 3B, the exemplary trellis 200 has M=2 states and edges that connect states of level n to states of level n+1. In one exemplary embodiment, each block 315 is encoded using a plurality of corresponding edges 220, 324 (in a given time index) in the trellis 200. As discussed further below in conjunction with FIG. 5B, each edge 324 is labeled by a block of n-bits. One method of encoding an input sequence using trellis edges is scrambling, such as XORing the trellis edge with the input block to provide a modulation block. For example, each n-bit block 315 from the user input sequence 310 can be XORed with each of the n-bit trellis edges 324 in the same time index, to generate a corresponding plurality of candidate output blocks. Thereafter, a Viterbi algorithm 320 selects one candidate output block for each time index as a winning output block, to form a winning path through the trellis 200 to a final state 326.

Encoding may include more complex mappings, such as non-linear scrambling, as would be apparent to a person of ordinary skill in the art. In addition, the exemplary encoding may be combined with an additional, optional encoding process, such as an inner modulation technique, for example, that scrambles the modulated data block prior to Viterbi processing.

A Viterbi algorithm 320 selects a winning path through the trellis 200 to a final state 326. Generally, the Viterbi algorithm 320 finds the path in the trellis 200 that minimizes the modulation metrics of the scrambled data. In various embodiments discussed below, the exemplary modulation metrics are used to suppress one or more error events by assigning a higher weight to longer transition runs; and/or assigning a higher weight to transitions than to non-transitions. Generally, the modulation metrics assign a higher weight to (and thereby penalize) edges that will likely be impaired by the channel.

The encoded output sequence 340 is generated by a scrambling process 330 in which the output sequence 340 is generated from scrambling the input block 315 with the edges 324 associated with the winning path with insertions of modulation bits 350, one modulation bit per each n-bit block 345. As previously indicated, the scrambling process 330 may comprise, for example, an XOR operation or it could be a more general mapping. A modulation bit 350 follows each n-bit modulated block 345, to indicate the winning edge. Finally, the exemplary encoded output sequence 340 terminates with a best state index 360 for the initial or final state, that is used in a manner discussed further below in conjunction with FIGS. 6A and 6B. Generally, demodulation is performed from the received modulation bits and the best state index, to de-scramble the received bits into the original user data.

Figure 4:
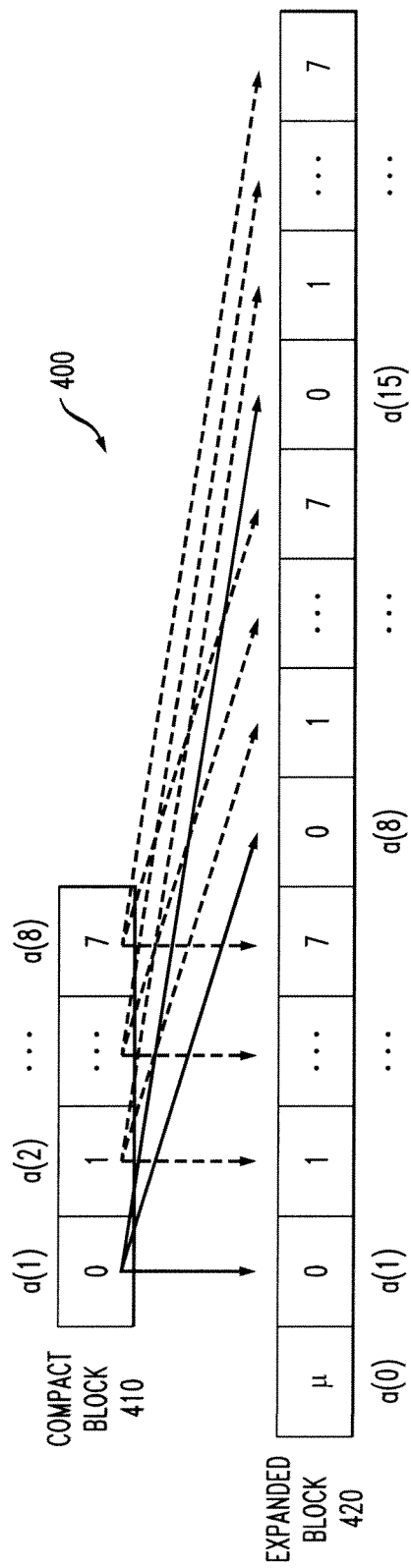
FIG. 4 illustrates an exemplary conversion of an 8-bit compact trellis block to an 80-bit expanded block.

As discussed above in conjunction with FIG. 2, each trellis edge 220 is labeled by a block of n bits (also referred to as a trellis block), and every trellis block can be applied to an input block to map/or scramble the input block into an encoded block. According to a further aspect of the invention, a compact presentation is employed for the exemplary trellis blocks. FIG. 4 illustrates an exemplary conversion 400 of an 8-bit compact trellis block 410 to an 80-bit expanded block 420. In this manner, fewer bits can be stored for each trellis block, for example, for high-rate coding applications. Generally, each bit in the compact block 410 is repeated multiple times as a whole, until the desired expanded block length is reached. For the exemplary conversion of an 8-bit block to an 80-bit block, each bit is repeated 10 times. It has been found that this compact trellis block structure does not degrade the modulation performance, and may help to implement RLL control.

According to another aspect of the invention, a complexity increase is avoided by using repeated blocks in the trellis structure 200. As discussed hereinafter, a special connection structure for repeated blocks (using them inside butterfly connections) can prevent performance degradation. In addition, performance can be further improved by ensuring a maximum distance separation between the converging trellis blocks. In one exemplary embodiment, Reed-Muller codewords are used as coset leaders to form other butterfly connections, thereby improving the trellis covering properties in the binary space.

FIG. 5A illustrates an exemplary 8-state trellis 500. The exemplary 8-state trellis 500 comprises 16 different edges. As shown in FIG. 5A, each edge has a corresponding 8-bit label Ex (corresponding to a compact block 410). As shown in FIGS. 5A and 5C, the trellis 500 is comprised of 4 different butterfly graphs 575. Each butterfly graph 575 has two different outgoing edges from each state. FIG. 5B is a table 550 illustrating the 8-bit pattern (compact blocks 410) associated with each different edge, such as edges 0-15. FIG. 5C illustrates an exemplary butterfly graph 575. The exemplary butterfly graph 575 comprises states 0 and 4 from level n and states 0 and 1 from level n+1. As indicated above, Reed-Muller codewords can be used as coset leaders to form all 8 butterfly butterfly connections.

As indicated above, the exemplary encoded output sequence 340 (FIG. 3B) terminates with a best state index 360 for the initial or final state. FIG. 6A illustrates an exemplary encoded output sequence 600 that employs a final state 640 in a traceback configuration, in accordance with a typical Viterbi algorithm that uses backward addressing for the path memory. The exemplary encoded output sequence 600 comprises a plurality of modulated blocks 610, each followed by a modulation bit 620. The final state index 640 follows the last block 630. This arrangement, however, can cause latency problems for the demodulator.

FIG. 6B illustrates an exemplary alternate encoded output sequence 650 that employs an initial state 655 in a forward addressing configuration for the path memory. Among other benefits, the forward addressing configuration reduces the latency of the decoder to a minimum, 1-block latency and supports an optional reduced path memory solution, discussed below. The exemplary encoded output sequence 650 comprises a plurality of modulated blocks 660, each followed by a modulation bit 670. The initial state index 655 precedes the initial block.

Modulation Metrics

As previously indicated, a Viterbi algorithm finds the path in the trellis 200 that minimizes the modulation metrics of the scrambled data. In various embodiments, the exemplary modulation metrics suppress one or more error events; assign a higher weight to longer transition runs; and/or assign a higher weight to transitions than to non-transitions. Generally, the modulation metrics assign a higher weight to (and thereby penalize) edges that will likely be impaired by the channel. In this manner, the metrics help to suppress error events that are harmful at high densities.

In one embodiment, the disclosed modulation metrics impose a higher weight on long transition runs, to improve modulation sequence properties at the Nyquist frequency, which could be especially harmful at a high recording density. In one exemplary implementation, shown in FIG. 7A, the modulation metrics are computed in a sliding bit window 710 that processes the encoded sequence 340. The window 710 moves across the encoded sequence 340, bit-by-bit. For example, as shown in FIG. 7A, a window 710 of size s=2*m+1=3 (m=1) is sliding across the encoded path 340.

FIG. 7B is a sample table 750 indicating the modulation metric value $\delta(x)$ for each possible 3-bit value in the window 710. The exemplary table 750 has $2^m$ (=8) entries. A first row indicates a "flat" modulation metric value $\delta_1(x)$, where a metric value of 1 is assigned for an NRZI bit value of 1, and a metric value of 0 is assigned for an NRZI bit value of 0. A second row indicates a "modified" modulation metric value $\delta_2(x)$, where a metric value is assigned based on the following formula:

$$\text{Metrics of extended signal edge } x^{(k)}: \mu(x^{(k)}) =$$
$$\sum_{i=0}^{n} \delta(x_{i-1}^{(k)}, x_i^{(k)}, x_{i+1}^{(k)}) = N_0 \cdot \delta(0) + N_1 \cdot \delta(1) + \ldots + N_7 \cdot \delta(7)$$

where $N_i$ is the number of times the combination "i" occurs in the sliding window 710. For example, in the case of modified metrics of FIG. 7B, we have:

$$\mu_2(x^{(k)}) = (N_2 + N_3 + N_6 + N_7) + 2*N_7,$$

so that, in other words, the metrics of the block can be computed as a sum of '1's in the block and the double number of occurrences of combination 111 in the encoded block. In this particular case, the modified metric is equal to 1 if the 3-bit window has a 1 in the middle and is equal to 0 if the 3-bit window has a 0 in the middle. In addition, the 3-bit value combination "111" has a penalized metric of 3, to result in a suppressed the number of occurrences of combination 111 in the encoded block.

Transition-Related Constraints

As previously indicated, the disclosed trellis modulation encoding techniques transform data into codewords according to one or more given constraints, such as transition-related constraints. As discussed below, the supported transition-based run-length constraints include run-length constraints and constraints on the number of permitted transitions. The disclosed trellis-based modulation encoder 110 supports transition-related constraints using trellis pruning techniques.

Figure 8:
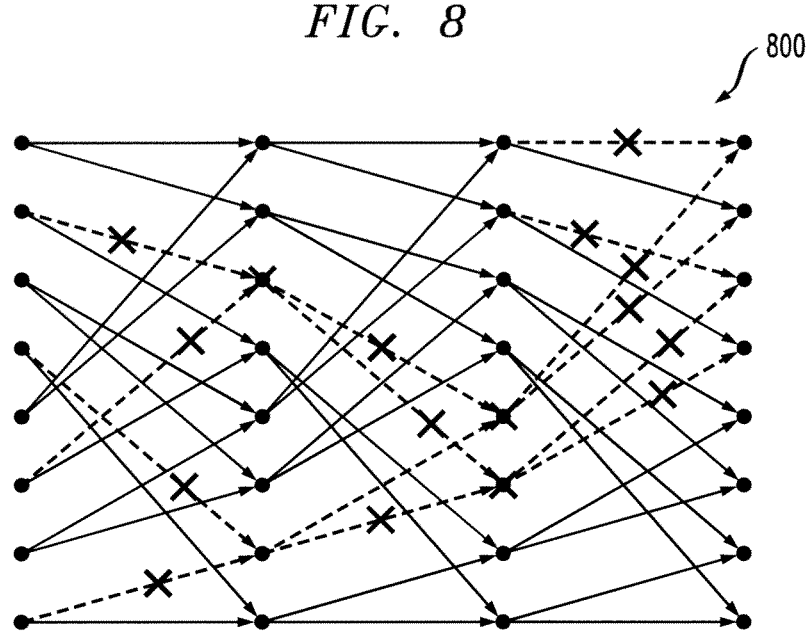
FIG. 8 illustrates the pruning of one or more edges in a trellis in accordance with disclosed trellis pruning techniques.

FIG. 8 illustrates the pruning of one or more edges in a trellis 800 in accordance with disclosed trellis pruning techniques. Generally, the trellis pruning techniques prune one or more paths in the trellis 800 to support run-length control. In an exemplary pruning strategy for run-length control, an edge is pruned if the candidate output block obtained from scrambling the input data block with this edge violates the run-length constraint by itself or in concatenation with the preceding edge. In addition, when all incoming edges to a given node are pruned, the corresponding state is also pruned. In FIG. 8, the pruned edges are shown using dashed lines. One exemplary run-length constraint requires that the maximal run length, j, for successive transitions and the maximal separation, k, between adjacent transitions are both 15 within a block length, n, equal to 100.

Following the application of the trellis pruning techniques to the trellis 800, the Viterbi algorithm selects the winning path from what remains.

Figure 9:
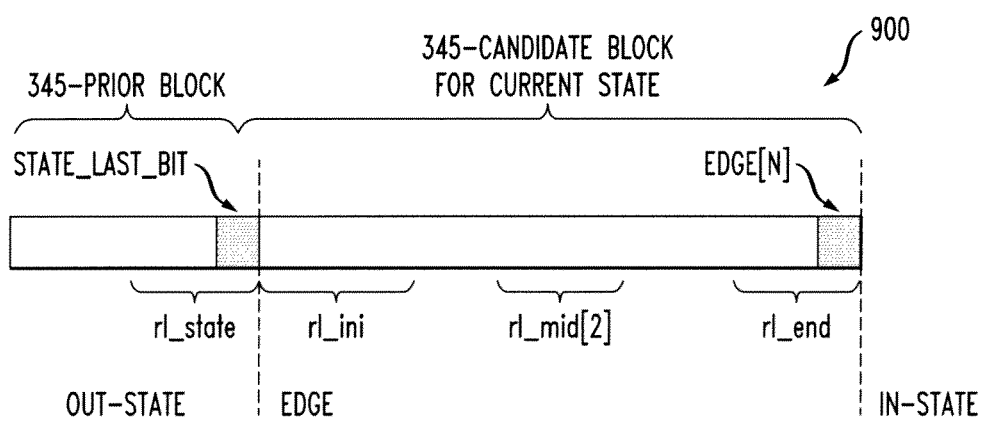
FIG. 9 illustrates an exemplary data record for run length information, for a trellis such as the trellis of FIG. 8.

FIG. 9 illustrates an exemplary run-length constraint technique 900 for implementing run-length constraints across a plurality of adjacent n-bit encoded blocks 345. The exemplary run-length constraint technique 900 maintains the run-length constraints across subsequent trellis states (e.g., across adjacent edges). As shown in FIG. 9, each n-bit encoded block 345 comprises state information indicating the polarity of the final bit (state_last_bit) and run-length information for the beginning and ending portions of the block (rl_ini and rl_end, respectively).

Generally, the polarity, P, of the final bit of the prior block (345-prior block) is compared to the polarity of the first bit in the candidate current block (345-candidate block). By definition, if the polarities are unequal, there will not be a violation of the run-length constraint. If the polarities are equal, however, a further test is performed to determine if the run-length for the ending portion of the prior block (rl_end) plus the run-length for the beginning portion of the current block (rl_ini) exceeds the run-length constraint, $k_p$. If the exemplary run-length constraint technique 900 determines that the run-length constraint is violated, then the current edge is pruned.

Reduced Path Memory

According to another aspect of the invention, a trellis modulation encoder is disclosed having a reduced path memory. Generally, the path memory is a critical element in any Viterbi algorithm implementation. Storing an entire sector of data may unnecessarily increase the complexity of the trellis modulation encoder. Thus, the path memory is optionally truncated to thereby reduce the complexity of the trellis modulation encoder.

Generally, it is known in channel applications to truncate the path memory to a smaller size. See, e.g., B. Vasic et al., Coding and Signal Processing for Magnetic Recording Systems (2004). The errors that result from the truncation are allowed, as long as the truncation error probability is sufficiently below the nominal error probability.

The present invention recognizes, however, that in modulation encoding, errors are not allowed. It is also important that path convergence may be slow due to the fact that there exists no main path in the trellis but all paths are equally important. Thus, one aspect of the present invention reduces the path memory without introducing truncation errors. The disclosed path memory reduction techniques also process the last bits of the path memory to avoid errors. In one implementation, the reduced path memory is achieved by further pruning the trellis. In other words, decisions taken from the reduced path memory can be used to prune the trellis states. In another implementation, the decisions from the reduced path memory are obtained by using a majority voting rule, discussed below, to thereby reduce the number of pruned states.

Thus, when the optional path memory reduction techniques are employed, the trellis is pruned from two sources. Edges in the trellis are pruned to achieve run-length control, and edges in the trellis are also pruned due to reduced path memory. In addition, pruned states may propagate from one section to another.

Figure 10:
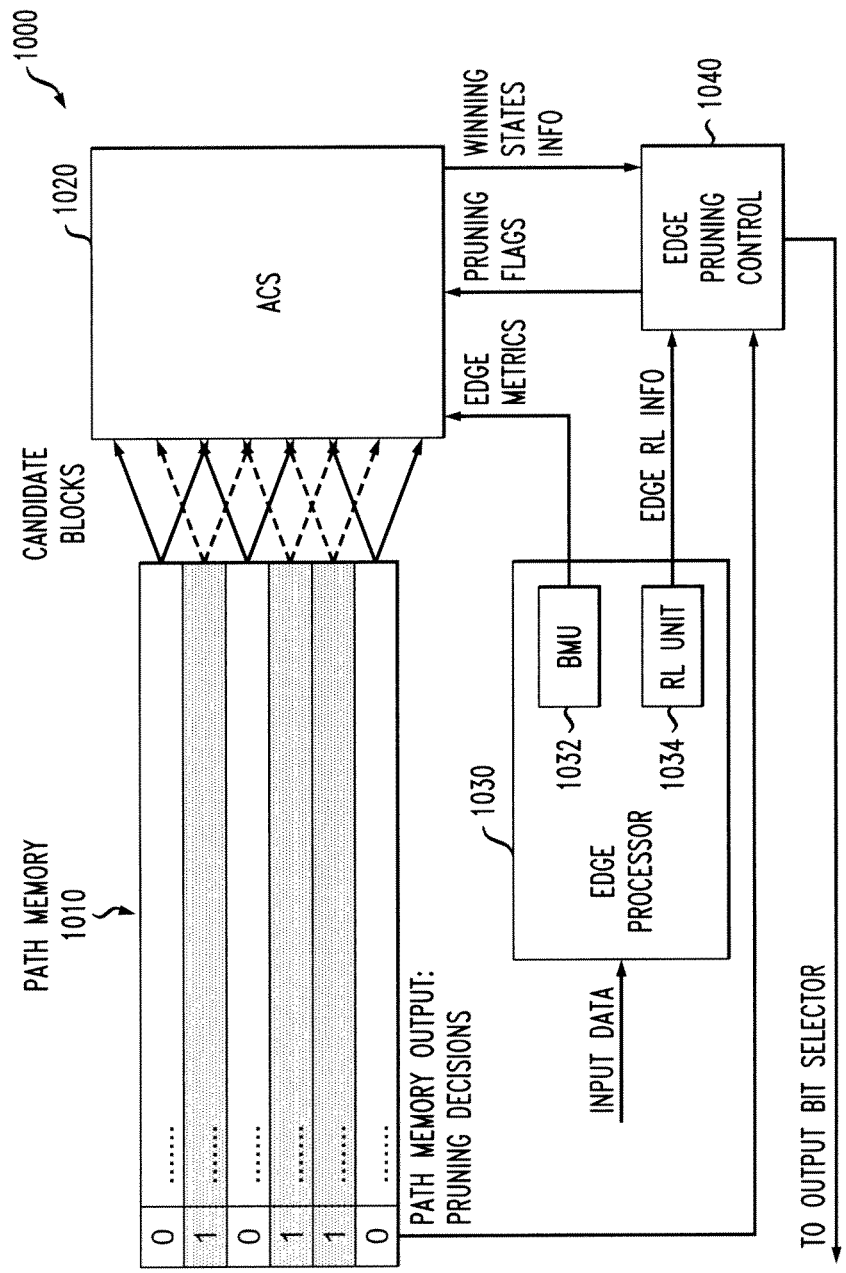
FIG. 10 is a schematic block diagram of a trellis modulation encoder that implements the Viterbi algorithm with a reduced path memory, in accordance with an embodiment of the present invention.

FIG. 10 is a schematic block diagram of a trellis modulation encoder 1000 that implements the Viterbi algorithm with a reduced path memory, in accordance with an embodiment of the present invention. As shown in FIG. 10, the exemplary trellis modulation encoder 1000 comprises a path memory 1010, an ACS block 1020, an edge processor 1030 and an edge pruning control unit 1040.

The ACS block 1020 processes the candidate blocks of the trellis and performs add-compare-select (ACS) decisions, in a known manner, on the pruned trellis. See, e.g., A. J. Viterbi, "Error Bounds for Convolutional Codes and an Asymptotically Optimum Decoding Algorithm," IEEE Trans. Inform. Theory, Vol. IT-13, 260-269 (April 1967).

As shown in FIG. 10, the edge processor 1030 includes a branch metrics unit (BMU) 1032 that performs metrics computation and provides computed metrics to the ACS block 1020. In addition, the edge processor 1030 includes a Run Length (RL) unit 1034 that provides run-length counts to the edge pruning control unit 1040. The edge pruning control unit 1040 processes the path memory output and implements the pruning control rules discussed above to generate one or more edge pruning flags (i.e., to identify edges in the trellis to be pruned that violate the run-length constraints or do not conform with past decisions).

In one exemplary embodiment, the path memory 1010 is initialized with binary state representations. For an exemplary 4-bit state implementation, the binary state representations will range from 0={0000} to 15={1111}. When the path memory decision is made in the ACS unit 1020 regarding the selected modulation edge, as described hereinafter, the best starting state is automatically selected from the path memory decisions.

The path memory decision is made as follows. Based on an exemplary majority voting rule, for 2 possible decisions (0 and 1), the number of states that will survive at the next ACS (Add Compare Select) cycle is estimated and the bit that has more survived states will be selected. In other words, the majority voting rule requires that the path memory decision is such that the number of survived states on the next level is maximized. For example, as shown in FIG. 10, the current path memory output comprises 3 zeroes and 3 ones. In accordance with the majority voting rule, the tie is broken to ensure the maximum number of states will survive at the input to the ACS block 1020.

In this manner, the number of pruned states in a trellis modulator is reduced and the support of the run-length constraints is provided.

Once the path memory output bit is selected in accordance with the majority voting rule, all states with a different output bit have to be pruned from the trellis. Thus, those states that opposed the majority voting rule are pruned. For example, if 0 is selected for the current path memory output (comprising 3 zeroes and 3 ones) then 1 is invalid at the output of the path memory 1010 and all states associated with a value of 1 are pruned.

Thus, the trellis is pruned to remove any edges that violate the run-length constraints and any states from the path memory that were not selected by majority voting rule.

Figure 11:
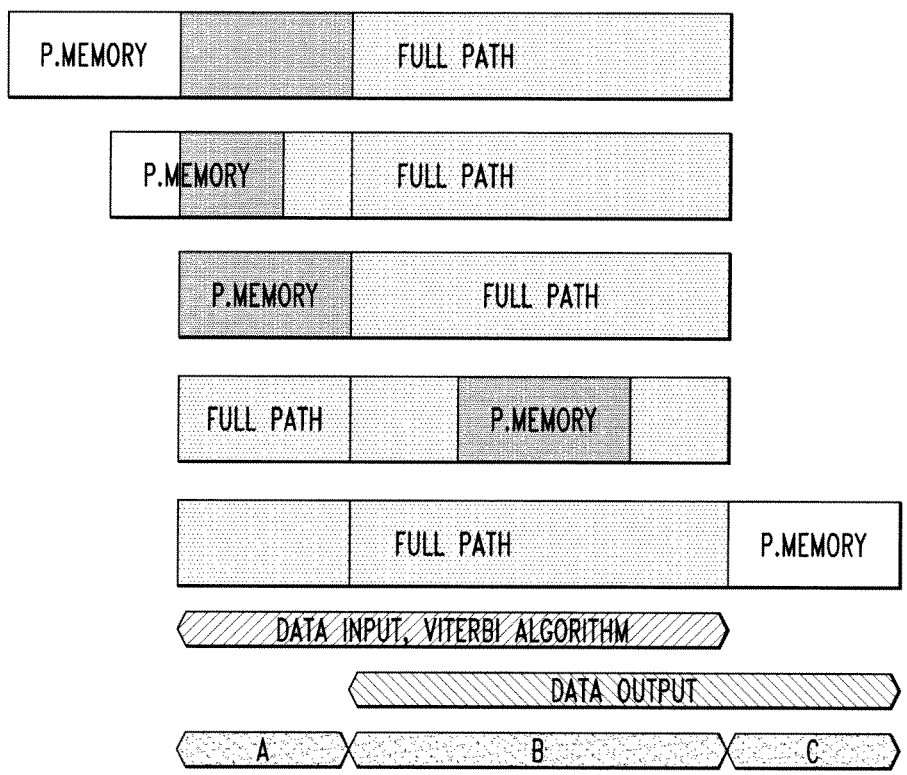
FIG. 11 is a timing diagram for trellis modulation with a reduced path memory, in accordance with an embodiment of the present invention.

FIG. 11 is a timing diagram 1100 for trellis modulation with a reduced path memory, in accordance with an embodiment of the present invention. During a first time interval (or stage) A, the Viterbi algorithm 1020 is active but no decisions are produced from the path memory 1010. In addition, during the first stage, pruning from the path memory 1010 is disabled and pruning for run-length control is enabled.

During a second stage B, the Viterbi algorithm is active and decisions are produced via the majority voting rule. In addition, during the second stage, pruning from the path memory 1010 and pruning for run-length control are both enabled.

During a third stage C, the Viterbi algorithm stops. The decisions are then taken from the path memory 1010. In addition, during the third stage, pruning from the path memory 1010 and pruning for run-length control are both disabled.

Hard Run Length Control

As indicated above, the exemplary run-length (j, k) constraints can be supported with low constraint violation probability. With low probability, it is possible, however, that all states can be pruned from the path memory 1010 or from the run-length control. For example, the probability of all states being pruned has been estimated to a probability below 1 e-15.

To prevent a catastrophic scenario if all were pruned from the path memory 1010, one aspect of the present invention optionally provides "hard" run-length control. Thus, the "hard" run-length constraint control is optionally activated when the exemplary run-length constraints prune all states. For example, one or more pruned states can be re-instated.

Encoder Block Diagram

Figure 12:
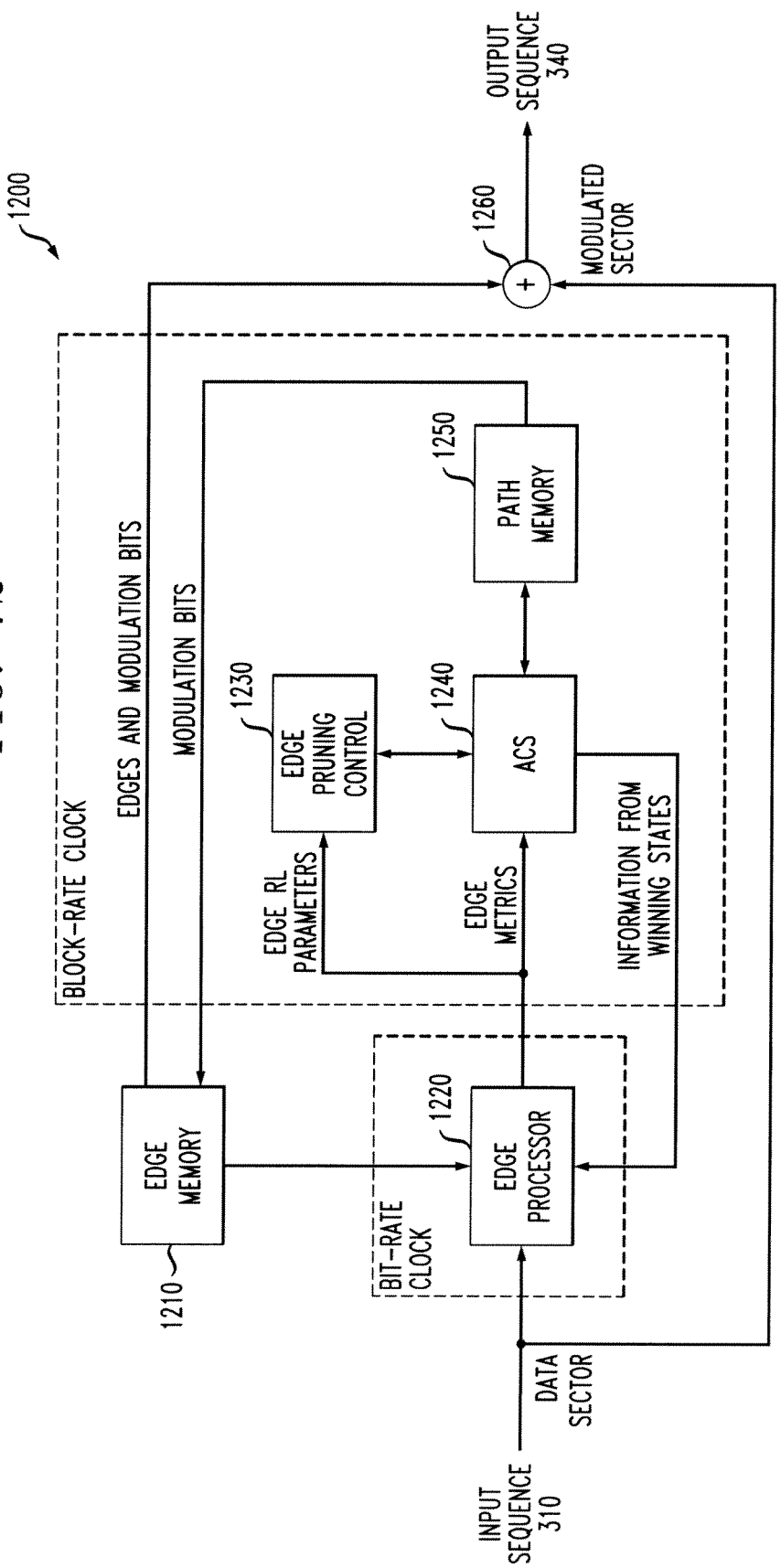
FIG. 12 is a block diagram of a trellis modulation encoder incorporating features of the present invention.

FIG. 12 is a block diagram of a trellis modulation encoder 1200 incorporating features of the present invention. As shown in FIG. 12, the exemplary trellis modulation encoder 1200 includes an edge processor 1220, a path memory 1250, an edge pruning control unit 1230, an ACS block 1240, and a path memory 1250, in a similar manner to FIG. 10. In addition, an edge memory 1210 is employed to store, respectively, and process the edges of the trellis. The edge processor 1220 processes the input sequence 310 (FIG. 3B) using the bit-rate clock.

The ACS unit 1240 processes the edge metrics and determines the winning path, in the manner discussed above, to determine the winning states. The information about the winning states is fed back to the edge processor 1220. The run-length control unit 1230 processes the edge run-length parameters from the edge processor 1220 and implements the run-length constraints, in the manner discussed above. The path memory 1250 is processed in the manner above to prune edges in the trellis that violate the run-length constraints and any edges from the path memory 1250 that were not selected by the majority voting rule. The block-rate processing may be performed, for example, at a rate that is $1/100$ of the bit clock rate, in case of an exemplary 100/101 code.

The output sequence 340 (FIG. 3B) is generated by a scrambling process 1260 that, for example, applies an exclusive or function (XOR) to the edges from the edge memory 1210 and the input sequence 310 (FIG. 3B). Alternatively, a more complex mapping can be applied, as would be apparent to a person of ordinary skill in the art.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for modulation encoding of a signal, comprising:
    encoding one or more blocks of said signal using, one or more corresponding edges in a trellis, wherein each edge in said trellis has a corresponding bit pattern;
    selecting a winning path through said trellis using a Viterbi algorithm based on at least one transition-based run-length constraint; and
    generating an encoded sequence using edges associated with said winning path.

2. The method of claim 1, wherein each block is encoded by scrambling said block with said one or more corresponding edges.

3. The method of claim 1, wherein each block is encoded with said one or more corresponding edges using an exclusive OR function.

4. The method of claim 1, further comprising the step of pruning an edge in said trellis if said edge violates a run-length constraint.

5. The method of claim 1, wherein said Viterbi algorithm selects said winning path through said trellis by minimizing one or more modulation metrics.

6. The method of claim 5, wherein said modulation metrics suppress one or more error events.

7. The method of claim 5, wherein said modulation metrics assign a higher weight to longer transition runs in binary data encoded in said signal.

8. The method of claim 5, wherein said modulation metrics are computed within a sliding window.

9. The method of claim 5, wherein said modulation metrics assign a higher weight to transitions than to non-transitions in binary data encoded in said signal.

10. The method of claim 1, wherein said generating step further comprises the step of inserting one or more of modulation bits and a state index.

11. The method of claim 1, wherein each edge in said trellis has a corresponding bit pattern that is stored with a reduced number of bits and is expanded to a number of bits associated with said blocks of said signal.

12. The method of claim 1, further comprising the step of pruning one or more edges in said trellis to reduce a path memory associated with said trellis.

13. The method of claim 12, further comprising the step of pruning one or more edges in said trellis that were not selected by a majority voting rule.

14. A system for modulation encoding of a signal, comprising:
a memory; and
at least one processor, coupled to the memory, operative to:
encode one or more blocks of said signal using one or more corresponding edges in a trellis, wherein each edge in said trellis has a corresponding bit pattern;
select a winning path through said trellis using a Viterbi algorithm based on at least one transition-based run-length constraint; and
generate an encoded sequence using edges associated with said winning path.

15. The system of claim 14, wherein each block is encoded by scrambling said block with said one or more corresponding edges.

16. The system of claim 14, wherein each block is encoded with said one or more corresponding edges using an exclusive OR function.

17. The system of claim 14, wherein said processor is further configured to prune an edge in said trellis if said edge violates a run-length constraint.

18. The system of claim 14, wherein said Viterbi algorithm selects said winning path through said trellis by minimizing one or more modulation metrics.

19. The system of claim 18, wherein said modulation metrics suppress one or more error events.

20. The system of claim 18, wherein said modulation metrics assign a higher weight to longer transition runs in binary data encoded in said signal.

21. The system of claim 18, wherein said modulation metrics are computed within a sliding window.

22. The system of claim 18, wherein said modulation metrics assign a higher weight to transitions than to non-transitions in binary data encoded in said signal.

23. The system of claim 18, wherein said processor is further configured to generate an encoded sequence by inserting one or more of modulation bits and a state index.

24. The system of claim 18, wherein each edge in said trellis has a corresponding bit pattern that is stored with a reduced number of bits and is expanded to a number of bits associated with said blocks of said signal.

25. The system of claim 18, wherein said processor is further configured to prune one or more edges in said trellis to reduce a path memory associated with said trellis.

26. The system of claim 25, wherein said processor is further configured to prune one or more edges in said trellis that were not selected by a majority voting rule.

27. An article of manufacture for modulation encoding of a signal, comprising a non-transitory machine readable recordable medium containing one or more programs which when executed implement the steps of:
encoding one or more blocks of said signal using one or more corresponding edges in a trellis, wherein each edge in said trellis has a corresponding bit pattern;
selecting a winning path through said trellis using a Viterbi algorithm based on at least one transition-based run-length constraint; and
generating an encoded sequence using edges associated with said winning path.

28. The article of manufacture of claim 27, wherein each block is encoded by scrambling said block with said one or more corresponding edges.

29. The article of manufacture of claim 27, further comprising the step of pruning one or more edges in said trellis for one or more of (i) a given one of said edges violates a run-length constraint; (ii) reducing a path memory associated with said trellis; and (iii) a given one or more of said edges were not selected by a majority voting rule.

30. The article of manufacture of claim 27, wherein said Viterbi algorithm selects said winning path through said trellis by minimizing one or more modulation metrics.

31. The article of manufacture of claim 30, wherein said modulation metrics comprise one of more of suppressing one or more error events;
assigning a higher weight to longer transition runs in binary data encoded in said signal;
computing said modulation metrics within a sliding window and assigning a higher weight to transitions than to non-transitions in binary data encoded in said signal.

32. The article of manufacture of claim 27, wherein said generating step further comprises the step of inserting one or more of modulation bits and a state index.

33. The article of manufacture of claim 27, wherein each edge in said trellis has a corresponding bit pattern that is stored with a reduced number of bits and is expanded to a number of bits associated with said blocks of said signal.

* * * * *